United States Patent [19]
Carney

[11] Patent Number: 6,043,668
[45] Date of Patent: Mar. 28, 2000

[54] PLANARITY VERIFICATION SYSTEM FOR INTEGRATED CIRCUIT TEST PROBES

[75] Inventor: Eric Lane Carney, San Antonio, Tex.

[73] Assignees: Sony Corporation, Tokyo, Japan; Sony Electronics, Inc., Park Ridge, N.J.

[21] Appl. No.: 08/991,788

[22] Filed: Dec. 12, 1997

[51] Int. Cl.[7] .................................................. G01R 31/00
[52] U.S. Cl. ........................................ 324/758; 324/754
[58] Field of Search .................................. 324/757, 758, 324/759, 754, 755, 756, 158.1

[56] References Cited

U.S. PATENT DOCUMENTS

| | | |
|---|---|---|
| 4,261,762 | 4/1981 | King . |
| 4,508,161 | 4/1985 | Holden . |
| 5,539,676 | 7/1996 | Yamaguchi .............................. 324/758 |
| 5,594,357 | 1/1997 | Nakajima ................................ 324/758 |
| 5,642,056 | 6/1997 | Nakajima et al. .................. 324/754 X |
| 5,731,708 | 3/1998 | Sobhani .................................. 324/758 |
| 5,861,759 | 1/1999 | Bialobrodski et al. ................ 324/758 |

*Primary Examiner*—Josie Ballato
*Assistant Examiner*—T. R. Sundaram
*Attorney, Agent, or Firm*—Wood, Herron & Evans, LLP

[57] ABSTRACT

A planarity verification system for proper positioning of testing probes comprises a plurality of electrical leads configured for connection to testing probes, an indicator electrically coupled to each of the leads, and a power source. One of the power source terminals is electrically coupled to the leads through the indicators and the other terminal is electrically coupled to a metalized surface such as a wafer to bias the surface. Each electrical lead forms part of a completed current path between the power source terminals when a testing probe contacts a biased surface and directs current through an associated indicator to provide an indication.

24 Claims, 1 Drawing Sheet

PLANARITY VERIFICATION SYSTEM FOR INTEGRATED CIRCUIT TEST PROBES

FIELD OF THE INVENTION

This invention relates generally to the testing and probing of integrated circuits formed on a semiconductor substrate and, more specifically, to a system for verifying the planarity of test probes and test equipment used for such testing.

BACKGROUND OF THE INVENTION

During the formation of integrated circuits (IC's) on the surface of a semiconductor substrate or wafer, the individual circuits or groups of circuits must be tested to determine that they were fabricated correctly and are functioning properly. Such testing is usually done upon completion of the wafer processing to determine if the wafer is suitable for being packaged into individual IC chips. Alternatively, the IC's might be tested at various stages during their processing to determine if future processing is desirable for a particular wafer or set of wafers, or whether the wafer or wafers should be discarded.

The testing of IC's on a wafer is done by using a probing machine or prober. The prober has a number of finely-constructed, elongated electrical probes which contact the surface of the wafer to make electrical contact with individual IC's thereon. The probes are connected to diagnostic equipment which is used to verify the operational characteristics of an IC, such as its resistance characteristics and its signal handling capabilities, for example.

Integrated circuit probers are commercially available, and one such suitable prober is available from KLA Instruments Corporation of San Jose, Calif. under Model No. KLA-1007. Probers usually have multiple, elongated test probes mounted next to each other on a planar probe card. The elongated probes extend downwardly from the probe card at various positions on the card. The probe card is a printed circuit board having conductive paths that are connected to the individual probes for electrically coupling the probes to the diagnostic equipment. The probe card, in turn, is mounted to a planar probe card mount or load board that is made of a suitable polymer such as glass epoxy laminate. The planar probe card and card mount form a probe card assembly. The individual elongated test probes, which may be, for example, tungsten or a beryllium/copper alloy, are connected through the probe card assembly to test leads on the probe card mount. The test leads provide a low resistance or "zero resistance" path to the probes for electrically connecting them to the diagnostic equipment.

In a prober, the planar probe card assembly is positioned opposite to (usually above) and parallel to the planar surface of the semiconductor wafer to be probed and tested. The wafer is supported below the assembly and probes by a suitable wafer chuck of the prober. For probing purposes, the chuck moves or translates vertically toward and away from the probe card assembly to position the wafer and IC's thereon against the ends of the test probes.

Ideally, the planar probe card assembly is parallel to the wafer surface and chuck and the probe ends all lie in a single plane which is also parallel to the plane of the wafer surface to be tested. In that way, when the chuck is moved toward the probe card assembly, the test probe ends contact the wafer surface evenly and at the same time and in the proper positions around the wafer. Usually the wafer chuck is moved slightly past the chuck position of initial probe contact with the wafer to ensure a good electrical contact between the probes and the ICs being tested. However, when the test probes are unevenly positioned and are not planar in a plane which is parallel with the plane of the wafer surface, damage to both the probes and the wafer may occur, because the ends of the test probes do not contact the wafer surface evenly as desired.

It will be understood by a person of ordinary skill in the art, that uneven probe positioning and uneven probe end contact on the wafer surface may be caused by a number of factors. For example, tilting of the planar probe card assembly and probes, or tilting of the wafer surface, each with respect to the other parallel component, will cause uneven probe end contact. Uneven contact is also caused by probe ends which are not properly positioned on the probe card assembly and are non-planar and/or non-parallel with respect to the plane of the wafer surface. More specifically, uneven contact exists when the probe ends are properly positioned on the probe card assembly, but the probe card assembly plane is not parallel to the wafer surface plane. Conversely, uneven contact also exists when the probe card assembly plane is parallel to the wafer surface plane, but the individual probe ends are not planar, and in a plane parallel with respect to the wafer surface plane. Both conditions will be referred to herein as non-planar probes, wherein planarity of the probes is desired. Planar probes will have ends all within a single plane, and that plane will be generally parallel to the wafer surface plane.

If the probes are non-planar with respect to the plane of the wafer surface, one or more of the probes will contact the wafer surface before the other probes. Uneven surface contact causes uneven wear of the probes at their ends and early replacement of certain probes on the board is then required. Probe replacement is an expensive and time-consuming endeavor. If the wafer chuck is moved only until certain of the probes first make contact, then other of the probes, which are not in the plane of the contacting probe, will not make solid electrical contact with the wafer. This prevents accurate testing of the wafer ICs.

Damage to the wafer is also caused by uneven probe contact. The uneven contact of the probes causes certain of the probes to contact the wafer before the other probes, as mentioned above. To compensate for the skewed or uneven probe contact, the chuck is moved further in the direction of the probe card assembly. While a certain amount of "over travel" of the chuck is used to ensure proper probe contact, too much over travel causes the ends of the probes which contacted earliest to slide out of their proper position on the wafer surface. The probe ends thus scratch the surface of the wafer as they slide, causing damage to the ICs formed at the surface. Even if no physical damage occurs, movement of the probe end from the desired position prevents accurate testing of the ICs.

Still further, uneven contact of the probes creates uneven stress on the probes. The probes are formed to be resilient under certain stresses; however, overstressing will cause the probes to break. The breakage will not only require replacement of the particular probe, but may damage the wafer as well.

Various prior art methods have been used for achieving parallel orientation and planarity between the individual probe ends and the wafer surface. However, those methods have proven generally unsatisfactory. Once such method is to imprecisely visually estimate the planarity and parallel orientation of the probe ends by variations in the size of the marks left on the wafer surface. Such a task is imprecise and tedious. Furthermore, the difficulty of estimating the planarity in such a way is further exacerbated by the small scale of the ICs. Slight variations of the probe ends from the desired plane and parallel orientation may be sufficient to cause damage to the IC before it is detectable in such fashion.

Another method is to make planarity measurements of the probe card mount in the wafer prober without the probe card attached thereto. Such planarity measurements are very time-consuming and will not guarantee that planarity and parallel orientation of the probes will be maintained upon mounting the probe card.

Furthermore, even when non-planarity of the probes is detected, it is still difficult to determine how the probes or probe card assembly should be adjusted for proper probe contact.

Therefore, it is an objective of the present invention to ensure planarity and parallel orientation of wafer test probes with respect to the surface of a wafer.

It is another objective of the present invention to provide even contact between the ends of the test probes and the wafer surface during testing procedures.

It is still another objective of the invention to provide an indication of the planarity or non-planarity of test probes with respect to a wafer surface.

It is another objective of the invention to prevent probe damage to the integrated circuits of a wafer being tested.

It is still another objective of the invention to verify the planarity and parallel orientation of the test probe ends in a simple and efficient manner.

SUMMARY OF THE INVENTION

The present invention addresses the above objectives by providing an indication of the position of each probe with respect to the planar wafer surface as the wafer is translated into contact with the testing probes. More specifically, each probe is coupled to an individual indicator which provides a visual indication of when the probe contacts the wafer surface.

The planarity verification system of the present invention includes a plurality of electrical leads, preferably including microclips, which are configured for connection to testing probes. The microclips are physically clipped onto terminals on the probe card mount which are connected through low resistance current paths to the testing probes. A lead is associated with each probe. A power source, preferably a battery, has one terminal electrically coupled to the leads and the other terminal electrically coupled to the wafer or other metalized surface to be analyzed for biasing the wafer or surface. An indicator is electrically coupled to each of said leads between the battery terminal and the lead. Therefore, each probe has an associated indicator. The indicator, which is preferably an LED, provides visual indication when electrical current flows therethrough, and a current limiting resistor associated with each LED ensures the proper current levels.

The testing probes, associated electrical leads, associated indicators, and the biased wafer provide a current path between the terminals of the battery. The wafer is translated on a moveable wafer chuck toward the testing probes to contact one or more of the testing probes. When contact is made between a testing probe and the biased wafer, a current path associated with that testing probe is completed and electrical current flows through the associated probe LED, illuminating the LED. In that way, a visual indication is provided when each probe contacts the wafer.

Preferably, the moveable wafer chuck is coupled to a measuring device which is capable of measuring the translation of the wafer chuck and wafer in fine increments, such as micron increments. The distance of wafer translation which is necessary to produce contact between each of the probes is measured. The difference between the distances measured for the adjacent testing probes provides an indication of the planarity, or lack of planarity, of the testing probes with respect to the planar surface of the wafer. For example, if all probes on one side of the probe card contact the wafer at the same distance measurement, but the probes on the other side of the probe card contact the wafer at a different distance, then the inventive system provides indication that the probe card assembly or wafer is tilted with respect to the other element. Alternatively, if various probes contact the wafer at various different measured distances, the inventive system provides an indication that the probes will require more complicated adjustment rather than simple tilting of the probe card assembly or the wafer.

A commercially available 9-Volt battery is suitable for use with the inventive system, and the current limiting resistors are connected in the current path with the LEDs for limiting the drain on the battery when the probes make contact with the wafer, thereby providing longer battery life. An ON/OFF switch is also coupled in line for selectively enabling or disabling the inventive system.

The present invention provides a system for verifying the planarity of the testing probes, including their parallel orientation with respect to the surface of the wafer. After various measurements are taken regarding the positions of the probes, the probes can be adjusted, either individually or through movement of the probe card or metal wafer to provide even contact between the ends of the test probes and the wafer surface. The inventive system is relatively inexpensive and simple to use and the LEDs provide a visual indication of the orientation and planarity of the test probes and associated testing equipment, thus providing proper testing procedures and preventing probe damage and damage to the integrated circuits on the wafer being tested.

BRIEF DESCRIPTION OF THE DRAWINGS

The accompanying drawings, which are incorporated in and constitute a part of this specification, illustrate embodiments of the invention and, together with a general description of the invention given below, serve to explain the principles of the invention.

DETAILED DESCRIPTION OF THE INVENTION

Figure 1:
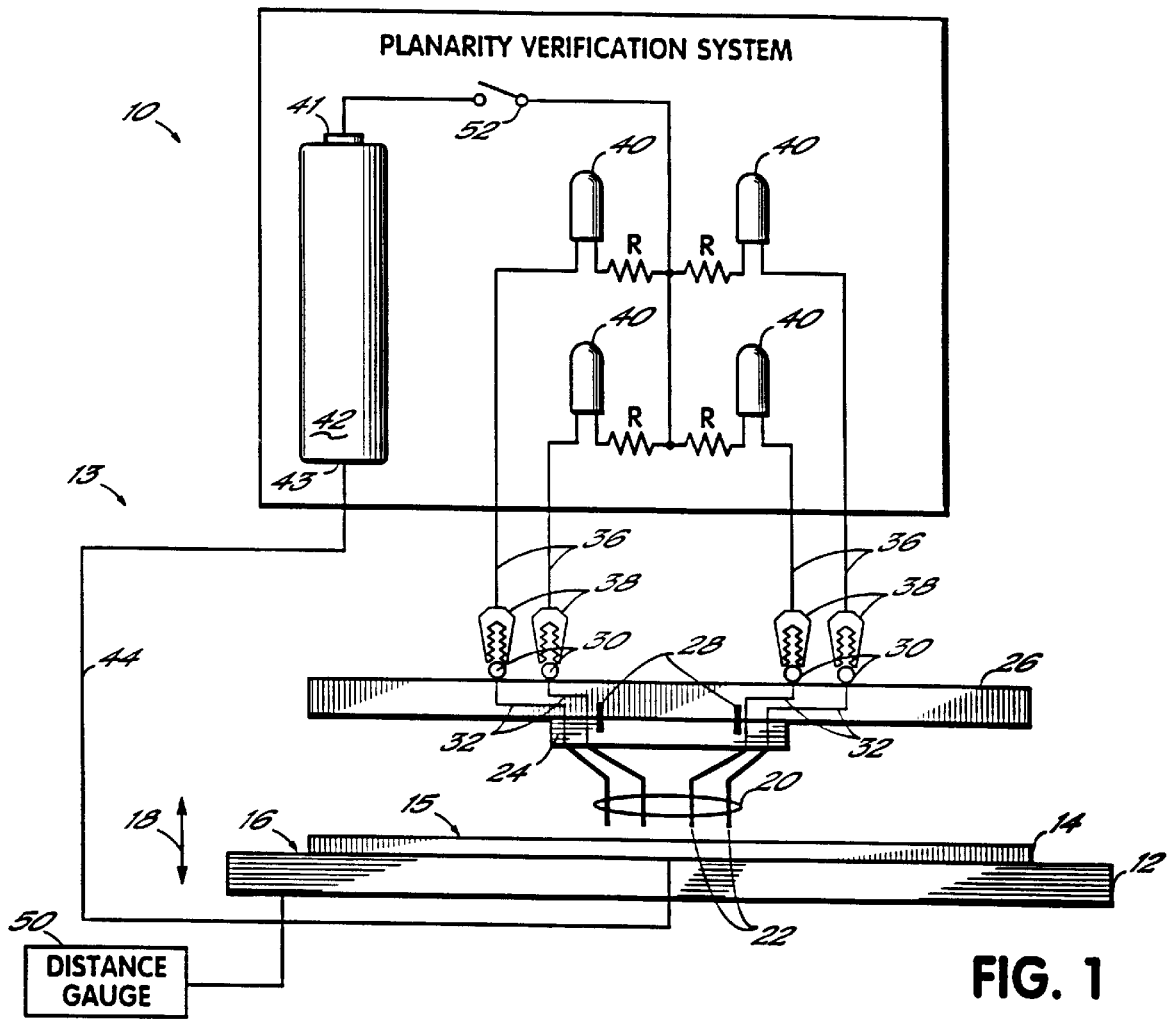
FIG. 1 is a side schematic view of a wafer prober utilizing the planarity verification system of the present invention.
Figure 2:
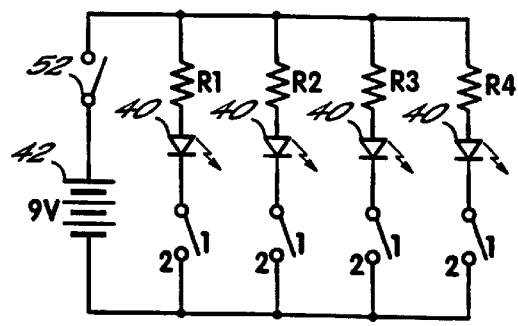
FIG. 2 is a circuit schematic of the planarity verification circuit of the present invention schematically illustrating the probes and biased wafer as portions of a switch.

FIG. 1 is a side view of one embodiment of the planarity verification system of the present invention. FIG. 2 provides a schematic illustration of the electrical operation of the various components of the inventive system.

Turning to FIG. 1, system 10 is utilized as part of a wafer probing system or prober 13 which is utilized to test and analyze the integrated circuits of a semiconductor wafer. Probers are commercially available and one such suitable prober is available from KLA Instruments Corporation of San Jose, Calif., under Model No. KLA-1007. The prober 12 essentially includes a wafer supporting chuck 12 which supports a semiconductor wafer 14 on an upper surface 16 thereof. The wafer 14, for the purposes of the invention, is preferably metalized. That is, it has a metal layer on the upper surface 15 or at least metalized layers on portions of surface 15. The metal layer on the wafer 14 is to ensure suitable electrical conductivity of the wafer when the invention is used. Wafer chuck 12 is vertically translatable in the direction of reference arrow 18 for moving wafer 14 vertically toward and away from testing probes 20 for analyzing the integrated circuits on wafer 14. Chuck 12 is part of the overall prober system.

The testing probes 20 are elongated, finely-constructed metal elements formed of tungsten or a beryllium/copper alloy. The probes have free ends 22 which contact the upper surface 15 of wafer 14 when the wafer 14 is moved against the probes 20. The other ends of the probes are mounted, such as by soldering, to a probe card 24. The probe card is a printed circuit board, preferably rectangular, which includes low-resistance, conductive paths 32 coupled to the various probes 20. In a preferred embodiment, probes are positioned at the four corners of the rectangular probe card 24.

The probe card 24 is mounted to an appropriate probe card mount 26. The probe card mount, also referred to as a load board, is formed of a suitable polymer, such as glass epoxy laminate. The probe card 24 is secured to card mount 26 by a plurality of securement pins 28. The probe card mount 26 includes a plurality of metal terminals 30 which are electrically coupled to the probes 20 through the low-resistance or "zero-resistance" paths 32. The terminals 30 may be any suitably conductive structure such as an excess amount of solder or an upstanding pin.

In accordance with the principles of the present invention, a plurality of electrical leads 36, including clipping devices, such as microclips 38, are coupled to the terminals 30 and thus are electrically coupled to the testing probes 20. Suitable microclip structures are available from Radio Shack.

Coupled to each lead 36 is an indicator which is operable for providing a humanly-perceptible indication when electrical current flows through the indicator. In a preferred embodiment of the invention, as illustrated in FIG. 1, one such suitable indicator is a light device, such as an LED 40, for providing a visual indication to an operator using the invention. The leads 36 and LEDs 40 are coupled to one terminal 41 of a power source, such as a battery. Another terminal 43 of the power source is electrically coupled to wafer 14 through the wafer chuck 12. As illustrated in FIG. 1, line 44 indicates the electrical coupling between terminal 43 and wafer 14. In that way, wafer 14, and particularly the metalized surface 15 of the wafer, is biased by power source 42. In a preferred embodiment of the invention, power source 42 is a battery, such as a commercially available 9-Volt battery, having a positive terminal 41 coupled to one side of the LEDs 40, and a negative terminal 43 coupled to wafer 14 to negatively bias the wafer and wafer surface 15.

The probes 20, clips 38 and leads 36, LEDs 40, and the wafer 14 on line 44 form a current path between the terminals 41,43 of battery 42. Each indicator is coupled between the leads 36 and clips 38 and the terminal 41. Current limiting resistors R1, R2, R3, R4 (R1–R4) are coupled between the LEDs 40 and terminal 41 for limiting the current traveling through the current path for proper operation of the LEDs. Referring to the bottom portion of FIG. 1, it will be seen that when wafer chuck 12 has been vertically translated to move the wafer 14 below the ends 22 of probes 20, the current path is broken to create an open circuit. In such a position, the probe ends 22 do not contact biased surface 15 of wafer 14, and thus no current flows through the LEDs 40 which are not illuminated. However, to determine the planarity of the probes 20, and specifically the probe ends 22 in accordance with the principles of the present invention, wafer chuck 12 is translated upwardly to move wafer 14 into contact with one or more of the probe ends 22. When one of the probe ends contacts wafer 14, a circuit path is completed to provide a complete current path between the battery terminals 41, 43. In that way, LEDs 40 associated with the contacting probes are illuminated. For proper electrical conduction, wafer 14 will generally be a metal coated wafer, or a wafer which is highly doped with a metal to provide a very low effective resistance to the current flow.

In that way, the inventive system 10 may be utilized to determine positioning of the probes 20 with respect to each other and also with respect to the planar upper surface 15 of wafer 14. As utilized herein, the term planarity verification is used to indicate that the probes 20, and specifically the ends of the probes 22, are all within a single plane, which plane is oriented parallel to the planar upper surface 15 of the wafer 14. Therefore, as mentioned above, the term "planarity" used to describe the probes 20 and probe ends 22 refers not only to all the ends being within a single plane, but also the characteristic that the plane is oriented parallel to the plane of wafer surface 15. When the ends of the testing probes 22 are planar, each of the probe ends 22 will contact wafer surface 15 at the same time when chuck 12 is translated vertically toward the probe card assembly, including the probe card 24 and the probe card mount 26. Planarity of the probes is the desired condition for proper utilization of the probes to test integrated circuits on the wafer upper surface 15. As mentioned above, if the probes are not planar, they will wear unevenly or break. Furthermore, if one or more probes are not planar, proper contact of all the probes will be difficult to achieve and wafer damage may also result.

The inventive system 10 provides a visual indication of the planarity or non-planarity of the various testing probes 20 and thus allows an operator to verify planarity or to determine how the probe card 24 or individual probes 20 should be moved to achieve planarity so that when wafer 14 is moved against the probes 20, all the probe ends 22 contact the wafer evenly and generally at the same time.

As discussed above, lack of planarity, as indicated by the system 10 of the invention, might be caused by a number of factors. For example, all the probes may be properly positioned on probe card 24; however, the probe card may be tilted with respect to the wafer surface 15. Alternatively, the probe card 24 and wafer surface 15 may be parallel, but one or more of the probes might be positioned such that its end 22 is out of the proper plane and thus will contact the wafer surface 15 before or after the other probes when chuck 12 is translated vertically toward the probe card assembly. Still further, the probe card 24 and wafer surface 15 may be parallel, and the probe ends 22 may be coplanar. However, the plane of the probe ends 22 might be tilted with respect to wafer surface 15. As a result of any one of the above scenarios, when the probes 20 are not planar, the LEDs 40 will be illuminated at different times corresponding to different heights of the wafer chuck 12 and wafer 14 as the chuck is translated. By monitoring the LEDs, an operator moving the chuck can verify which probe or probes are out of position. Accordingly, adjustments to the probe card assembly and/or the individual probes 20 may be made to achieve planarity. Adjustment of the wafer chuck 12 and the wafer 14 might also be made. However, adjustment is substantially more difficult than adjusting the probe card assembly and probes.

In a preferred embodiment of the invention, the translatable chuck 12 of the prober includes a distance gauge for measuring the translation distance in the direction of arrow 18. In the art, the vertical motion of the wafer chuck and wafer in the direction of arrow 18 is generally referred to as the Z-motion of the wafer, corresponding to a Z-coordinate axis, wherein the plane defined by the X and Y Coordinate axes is the plane of wafer surface 15. Distance gauge 50, in one embodiment of the invention, is a micrometer, which measures the Z-motion in microns ($\mu$m).

While there may be various reasons for lack of planarity with respect to the ends of the probes 22 and their uneven contact with wafer surface 15, a predominant reason for the lack of planarity within a prober is lack of parallel orientation of the probe card 24 with respect to wafer surface 15 when the probe card is installed within the wafer prober. Accordingly, once the planarity measurements are made utilizing the present invention, the probe card will generally be adjusted according to well-known principles to achieve planarity and an even contact between the probe ends 22 and wafer surface 15.

To measure planarity, wafer chuck 12 is translated vertically until the probes engage wafer surface 15. The operator analyzes each of the individual LEDs 40 to determine which LEDs are illuminated, and in what order, as the probe ends 22 contact surface 15. If all of the probe ends 22 contact surface 15 generally at the same time, the invention will indicate such by simultaneous, or almost simultaneous, illumination of the LEDs 40. If one or more of the LEDs lights before the other LEDs, lack of planarity is indicated by the invention. Monitoring the distance gauge, the difference in distance between the first probe to engage and the last probe to engage is measured, as well as the distance variations between the first and last probes and the other probes of the system. For a probe card which is tilted, the probes on one side of the card will contact before the probes on the other side of the card. For other variations between wafer surface 22 and the ends 22 of the probes, different illumination patterns of LEDs 40 will occur. Once the variation in planarity is known to an operator using the invention, a person of ordinary skill in the art will be able to adjust the probe card and/or individual probes until even contact and planarity is achieved. In the preferred embodiment of the invention, several planarity readings are made to ensure proper positioning of the probes 20 and to verify their position once positioned. While the Figures of the application illustrate four probes, it will be readily understood that an additional number of probes may be utilized as well, in accordance with the principles of the present invention for further verifying the planarity of the probe card and the ends 22 of the probes with respect to the wafer surface 15.

FIG. 2 illustrates an electrical schematic of the effective circuit provided by the inventive system 10 as utilized with the prober. The electrical leads 36, clips 38, probes 20, and wafer 14 effectively form a plurality of electrical "switches." In an open condition, or Position 1, as illustrated in FIG. 2, the probes are suspended above wafer 14 and the various circuits, or current paths, are open. In that way, no current flows through the LEDs 40 to illuminate the LEDs and to provide a visual indication that the probe 20 is contacting wafer surface 15. In Position 2, as illustrated in FIG. 2, wafer chuck 12 is translated to move wafer surface 15 into contact with the probe ends 22 to complete various of the current paths associated with the LEDs. Each contacting probe closes the current path, or closes the switch, as indicated in FIG. 2 so that current flows between the battery terminals 41, 43 and through the LEDs 40 to illuminate the LEDs.

The main power switch 52 may be utilized in line with the current path formed by the inventive planarity verification system 10, the wafer chuck, and probe card assembly for turning system 10 ON and OFF as appropriate. Switch 52 also prevents premature draining of the battery.

Since test hardware associated with the wafer prober may be damaged by the biasing provided by battery 42, certain of the test hardware may need to be electrically disconnected from the probe card assembly and/or the wafer chuck to avoid such damage.

In the embodiment of the invention illustrated in the Figures, the planarity verification system 10 is shown as a separate system which is electrically coupled to the hardware of a prober. However, in an alternative embodiment of the invention, system 10 may be incorporated into the probe card assembly as desired.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. A planarity verification system for proper positioning of testing probes used to analyze integrated circuits on a wafer, the system comprising:

a plurality of electrical leads, each lead configured for connection to a testing probe;

a light device electrically coupled to each of said leads and operable for being illuminated and providing an indication when an electric current flows therethrough;

a power source for providing electric current between opposing terminals thereof, one of said terminals being electrically coupled to said leads through the indicators and the other of said terminals being electrically coupleable to a wafer to be analyzed for biasing the wafer;

each electrical lead forming part of a completed current path between said power source terminals when a testing probe connected to said lead contacts a biased wafer being analyzed, the lead directing current along said current path and through an associated indicator to provide an indication;

whereby the contact of a testing probe with a wafer is indicated for determining the position of the probes with respect to the wafer.

2. The system of claim 1 wherein said electrical lead includes a clip operable for physically clipping to a portion of a conductive path connected to a probe.

3. The system of claim 1 further comprising a current limiting resistor coupled between said indicator and said power source terminal coupled to the indicator.

4. The system of claim 1 wherein said power source includes a battery.

5. A planarity verification system for proper positioning of testing probes used to analyze integrated circuits of a semiconductor wafer, the system comprising:

a metalized wafer containing integrated circuits;

a plurality of testing probes for contacting said wafer to analyze integrated circuits thereon;

a light device electrically coupled to each of said probes and operable being illuminated and for providing an indication when an electric current flows therethrough;

a power source for providing electric current between opposing terminals thereof, one of said terminals being electrically coupled to said probes through the indicators, the other of said terminals being electrically coupled to said wafer to bias the wafer;

each probe forming part of a completed current path between said power source terminals when the probe contacts the biased wafer, the current path directing current through an indicator associated with the probe to provide an indication of the probe contact;

whereby the contact of a testing probe with a wafer is indicated for determining the position of the probes with respect to the wafer.

6. The system of claim 5 wherein each of said testing probes includes a conductive path, the system further comprising a plurality of electrical leads, each lead configured for connection to a testing probe through said conductive path.

7. The system of claim 5 further comprising a current limiting resistor coupled between said indicator and said power source terminal coupled to the indicator.

8. The system of claim 5 wherein said power source includes a battery.

9. The system of claim 5 further comprising a wafer chuck to support the wafer, one of said wafer chuck and said plurality of testing probes being translatable for providing contact between said probes and said biased wafer.

10. The system of claim 9 further comprising a gauge for measuring the translation of one of said plurality of testing probes and said wafer chuck, said gauge providing a measurement of distance translated for contact between said probes and biased wafer.

11. A method of verifying the planarity of testing probes used to analyze integrated circuits on a semiconductor wafer, the method comprising:

positioning a wafer opposite a plurality of testing probes;

biasing the testing probes with one terminal of a power source and biasing the wafer with another terminal of the power source to form a current path between the terminals;

electrically coupling a light device to each test probe and in said current path, the indicator operable for being illuminated and providing an indication when current from said current path flows therethrough;

translating one of said wafer and said plurality of test probes to produce contact between at least one of the probes and the biased wafer to complete said current path so that current flows through the associated indicator to provide an indication of the probe contact;

whereby the contact of a testing probe with the wafer is indicated for determining the position of the probes with respect to the wafer.

12. The method of claim 11 further comprising limiting the current flowing in said current path.

13. The method of claim 11 wherein said power source includes a battery.

14. The method of claim 11 further comprising measuring the translation of one of said wafer and said plurality of testing probes to provide a measurement of distance translated to produce contact between a probe and the wafer.

15. The method of claim 14 further comprising comparing the distance measurement for at least one of said probes to the distance measurement for another of said probes to determine a distance differential between the probes for determining the planarity of the probes with respect to the wafer.

16. A planarity verification system for proper positioning of testing probes, the system comprising:

a plurality of electrical leads, each lead configured for connection to a testing probe;

a light device electrically coupled to each of said leads and operable for being illuminated and providing an indication when an electric current flows therethrough;

a power source for providing electric current between opposing terminals thereof, one of said terminals being electrically coupled to said leads through the indicators and the other of said terminals being electrically coupleable to a generally planar metal surface for biasing the metal surface;

each electrical lead forming part of a completed current path between said power source terminals when a testing probe connected to said lead contacts the biased surface, the lead directing current along said current path and through an associated indicator to provide an indication;

whereby the contact of a testing probe with the metal surface is indicated for determining the position of the probes with respect to the surface.

17. The system of claim 16 wherein said electrical lead includes a clip operable for physically clipping to a portion of a conductive path connected to a probe.

18. The system of claim 16 further comprising a current limiting resistor coupled between said indicator and said power source terminal coupled to the indicator.

19. The system of claim 16 wherein said power source includes a battery.

20. A method of verifying the planarity of testing probes, the method comprising:

positioning a generally planar metal surface opposite a plurality of testing probes;

biasing the testing probes with one terminal of a power source and biasing the metal surface with another terminal of the power source to form a current path between the terminals;

electrically coupling a light device to each test probe and in said current path, the indicator operable for being illuminated and providing an indication when current from said current path flows therethrough;

translating one of said metal surface and said plurality of test probes to produce contact between at least one of the probes and the surface to complete said current path so that current flows through the associated indicator to provide an indication of the probe contact;

whereby the contact of a testing probe with the surface is indicated for determining the position of the probes with respect to the surface.

21. The method of claim 20 further comprising limiting the current flowing in said current path.

22. The method of claim 20 wherein said power source includes a battery.

23. The method of claim 20 further comprising measuring the translation of one of said metal surface and said plurality of testing probes to provide a measurement of distance translated to produce contact between a probe and the surface.

24. The method of claim 23 further comprising comparing the distance measurement for at least one of said probes to the distance measurement for another of said probes to determine a distance differential between the probes for determining the planarity of the probes with respect to the surface.

* * * * *